(12) United States Patent
Olpak et al.

(10) Patent No.: US 8,783,181 B2
(45) Date of Patent: Jul. 22, 2014

(54) DETECTING AN UNSECURED STATE OF A MANDREL

(75) Inventors: Tamir Olpak, Petah Tigwa (IL); Arie Gez, Netanyya (IL)

(73) Assignee: Eastman Kodak Company, Rochester, NY (US)

( * ) Notice: Subject to any disclaimer, the term of this patent is extended or adjusted under 35 U.S.C. 154(b) by 198 days.

(21) Appl. No.: 13/366,403

(22) Filed: Feb. 6, 2012

(65) Prior Publication Data

US 2013/0199389 A1  Aug. 8, 2013

(51) Int. Cl.
*B41F 13/10* (2006.01)
*B41F 1/34* (2006.01)
*B41C 1/00* (2006.01)
*B41C 1/05* (2006.01)
*G03F 7/20* (2006.01)

(52) U.S. Cl.
CPC ... *B41C 1/00* (2013.01); *B41C 1/05* (2013.01); *G03F 7/2055* (2013.01)
USPC ............ 101/480; 101/375; 101/481; 101/485

(58) Field of Classification Search
CPC .................................. B41J 33/04; B41J 33/08
USPC ................... 101/479, 481, 480, 485; 464/23; 73/462, 468
See application file for complete search history.

(56) References Cited

U.S. PATENT DOCUMENTS

| 4,169,383 | A  | * | 10/1979 | Guyot et al. ..................... 73/462 |
| 5,329,814 | A  | * | 7/1994  | Betz et al. ....................... 73/462 |
| 8,466,943 | B2 | * | 6/2013  | Ellin et al. ..................... 347/224 |

* cited by examiner

*Primary Examiner* — Daniel J Colilla
*Assistant Examiner* — Justin Olamit
(74) *Attorney, Agent, or Firm* — Nelson Adrian Blish

(57) ABSTRACT

A mandrel position analyzer (108) in an imaging device (100) includes a head stock (144) for a first side of the mandrel; a tail stock (104) for a second side of the mandrel; a first encoder (212) attached to the head stock adapted to measure first signals wherein the first signals are generated by movement of the mandrel; a second encoder (208) attached to the tail stock adapted to measure second signals wherein the second signals are generated by movement of the mandrel; an analyzer (224) which compares measured results of the first signals and results of the second signals; and if the measured results do not match generating an abnormal state of the mandrel signal alarm (260).

2 Claims, 2 Drawing Sheets

DETECTING AN UNSECURED STATE OF A MANDREL

CROSS REFERENCE TO RELATED APPLICATIONS

Reference is made to commonly-assigned U.S. patent application Ser. No. 13/366,409 (now U.S. Publication No. 2013/0199390) filed Feb. 6, 2012, entitled DETECTING AN UNSECURED STATE OF A MANDREL, by Olpak et al.; and U.S. patent application Ser. No. 13/279,370 (now U.S. Pat. No. 8,441,280), filed Oct. 24, 2011, entitled SAFETY COMPONENT IN A PROGRAMABLE COMPONENTS CHAIN, by Arie Gez; the disclosures of which are incorporated herein.

FIELD OF THE INVENTION

This invention relates to a laser imaging device for flexographic sleeves installed on a detachable mandrel and more specifically to detecting an unsecured mandrel in an imaging device.

BACKGROUND OF THE INVENTION

In many types of printing, particularly flexographic printing, offset printing and screen printing, there is an advantage in using seamless sleeves as printing elements instead of plates wrapped around printing cylinders. Seamless sleeves allow printing of continuous patterns. The use of seamless sleeves allows printing presses to operate in a smoother manner. Before a sleeve can be mounted on a printing press it has to be imaged and processed, although some materials are available today which do not require processing. The printing sleeves 116 are imaged on laser imaging device 100 as is shown in FIG. 1.

Such machines have a mandrel 108 on which a printing sleeve 116 is mounted directly. The mandrel 108 is secured in the imaging device 100 at two ends by a tail stock 104 and a head stock 144. A laser imaging head 120 is adapted to travel along the longitudinal axis of the printing sleeve 116 on imaging head tracks 124, controlled by lead screw 128.

Printing sleeve 116 is loaded over the mandrel 108. The printing sleeve 116 may be a thin-walled metal or composite cylindrical tube with media applied to the outer surface. The mandrel 108 may be provided with a number of air holes 112 in its surface through which air can be forced. This air flow creates an air bearing over mandrel 108 and permits printing sleeve 116 to be floated on a cushion of air onto the mandrel 108, the air expanding printing sleeve 116 to enable easy loading and positioning. The air is supplied by air source 140 through air hose 136. Air hose 136 is fixed to air source 140 on one side and to air inlet 132 on mandrel 108 on the other side of the air hose 136. When the supply of forced air is discontinued, printing sleeve 116 contracts to form a tight fit with mandrel 108.

Mandrel 108 is heavy and rotates at high speed. It is important, therefore, that the mandrel be securely attached at both ends. Detecting whether the mandrel 108 is securely fastened to both the trail stock 104 and head stock 144 is necessary to prevent problems during normal operation of imaging device 100.

SUMMARY OF THE INVENTION

Briefly, according to one aspect of the present invention a mandrel position analyzer in an imaging device includes a head stock for a first side of the mandrel; a tail stock for a second side of the mandrel; a first encoder attached to the head stock adapted to measure first signals wherein the first signals are generated by movement of the mandrel; a second encoder attached to the tail stock adapted to measure second signals wherein the second signals are generated by movement of the mandrel; an analyzer which compares measured results of the first signals and results of the second signals; and if the measured results do not match generating an abnormal state of the mandrel signal alarm.

The invention and its objects and advantages will become more apparent in the detailed description of the preferred embodiment presented below.

DETAILED DESCRIPTION OF THE INVENTION

In the following detailed description, numerous specific details are set forth in order to provide a thorough understanding of the disclosure. However, it will be understood by those skilled in the art that the teachings of the present disclosure may be practiced without these specific details. In other instances, well-known methods, procedures, components and circuits have not been described in detail so as not to obscure the teachings of the present disclosure.

Figure 1:
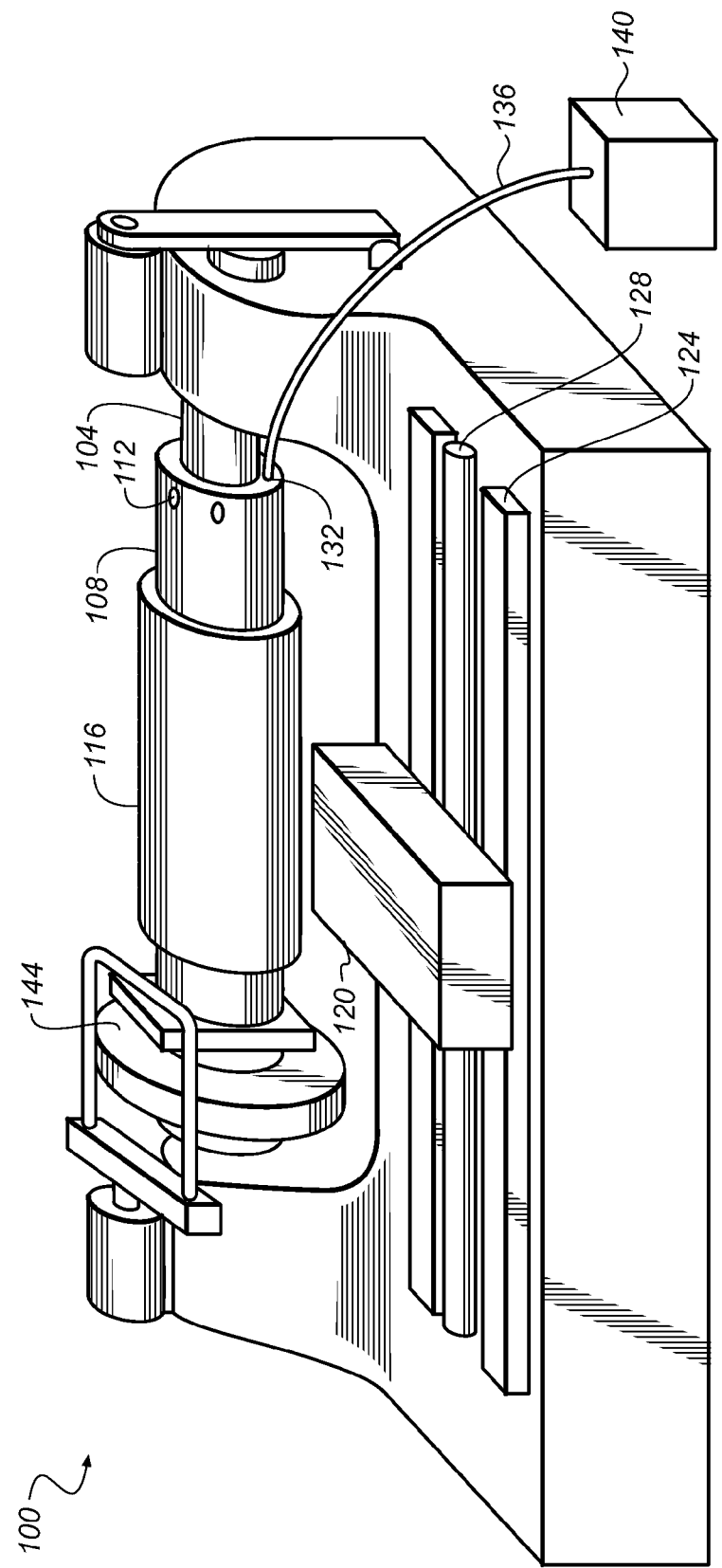
FIG. 1 is a schematic showing a prior art laser processing system with a sleeve mounted on a mandrel adaptor using air supply.
Figure 2:
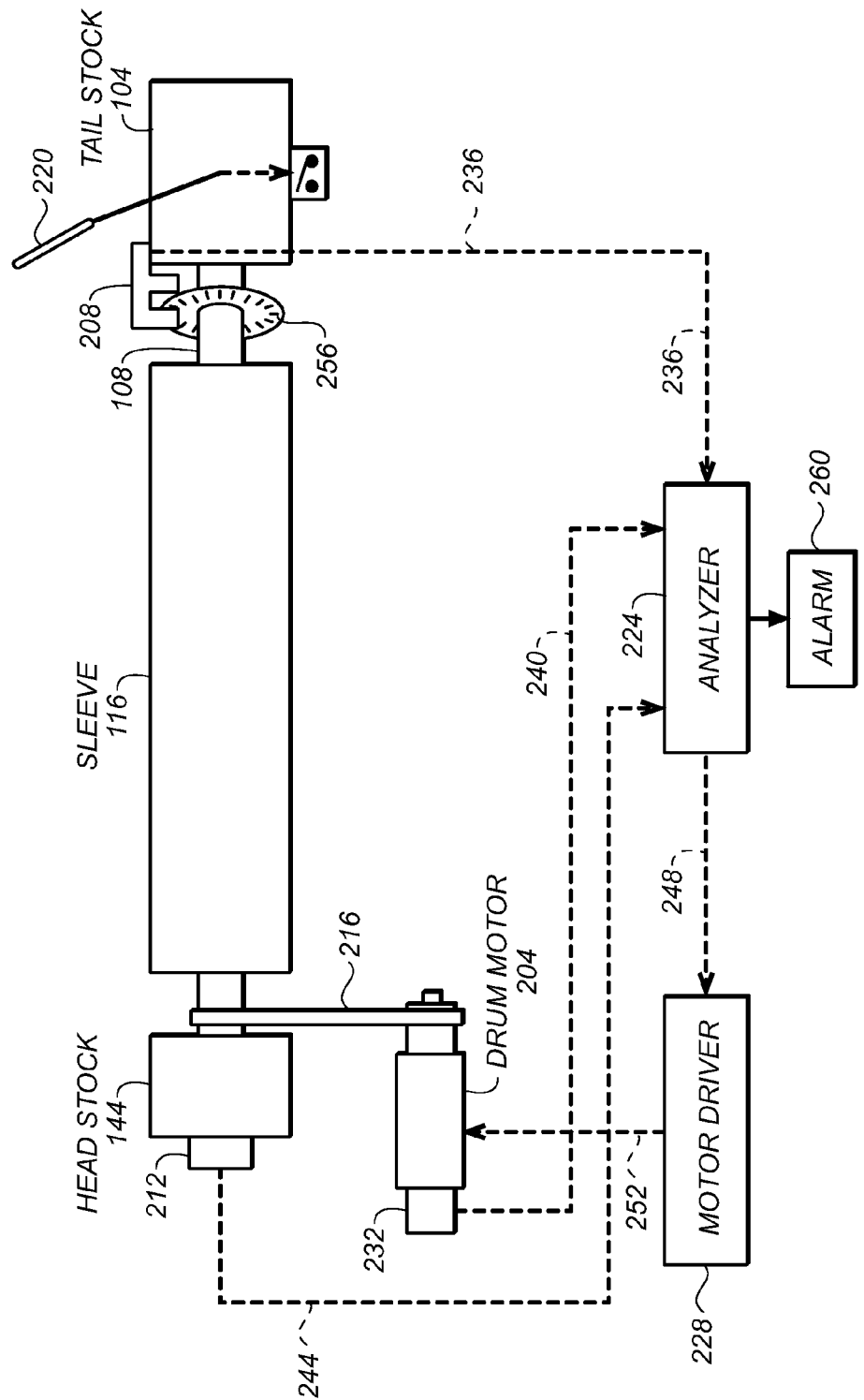
FIG. 2 is a schematic showing the mandrel setup between the head stock and the tail stock and encoder logic to detect whether the mandrel is secured between tail and head stock.

Mandrel 108 may spin in the imaging device 100 during imaging at speeds such as 1600 revolutions per minute (RPM). Since mandrel 108 is detachable it is necessary to assure it is properly locked in position with mandrel lock 220 as shown in FIG. 2. A mandrel 108 if detached from its secure position may cause injury, or in cases where the mandrel is not perfectly positioned, imaging quality artifacts may show on the printed material. The mandrel 108 is detachable, the mandrel design includes a screw attachment connected to spindle assembly 144 (head stock) from one side and to a "stinger" 104 connected (tail stock) on the other side.

The mandrel 108 may slightly slip from its operational position especially when mandrel 108 rotates at high speeds. In this case the cruise rotation speed may be right but the mandrel 108 image tracking mechanism will lose position. The position of mandrel 108 in the imaging device 100 is detected by encoders on both sides of the mandrel. Encoder 208 is attached to the tail stock 104 and monitors the mandrel 108 revolution next to the tail stock 104. Encoder 212 is attached to head stock 144 and monitors mandrel movement next to head stock.

The rotational speed of mandrel 108 on both ends of the mandrel is measured at the head stock 144 and tail stock 104. A comparison is made between the measurements at the tail and head stocks. Whether the mandrel is perfectly secured between the two ends 104 and 144, or whether mandrel 108 is not well secured is determined by a speed differential between the encoders.

Two encoders are used in this configuration. Encoder 212 on spindle (head stock) 144, and encoder 208 on tail stock 104. The encoders will constantly measure the signals and pulses which are generated at each of the ends during mandrel 108 rotation. The results of the encoders (number of pulses per full rotation) can also determine the level and severity of abnormal position of mandrel 108 in imaging device 100.

Head stock 144 is driven by a belt 216 which is connected to drum motor 204. A third encoder, drum motor encoder 232 is attached to motor 204. A comparison between the results of encoder 232 and 212 is made during operation of the imaging device 100. If the results of encoder 232 and 212 do not match then an abnormal state of the mandrel operation is detected. The comparison may help determine whether belt 216 is properly positioned between the drum motor 204 and spindle 144 (head stock).

Analyzer 224 is configured to read results acquired by encoders 208, 212, and 232. Input data from tail stock is received by analyzer 224 via input line 236 from tail stock, input data from head stock is received via input line 240 from head stock, and input line from drum motor is received via input line 244 from the drum motor.

The analyzer 224 will process the results acquired from all encoders (208, 212, 232), each encoder is adapted to handle input data in speeds of hundred thousand pulses per minute. In one embodiment, when an abnormal situation is encountered in the operation of the mandrel 108, an alarm 260 alerts an operator. The operator makes a decision whether to stop the operation of the imaging device or to reduce the spinning speed of the mandrel. Example of abnormal operation of the mandrel may include, mandrel slippage, mandrel vibration during spinning, or the imaging device being started without an installed mandrel. In another embodiment, the process may be automated.

Slippage of the mandrel can be detected in various slippage degrees. The degree of slippage can be derived dependent on the number of encoder slots 256 in tail stock encoder 208. In the case when a hazardous state of the mandrel 108 is detected by analyzer 224, the analyzer will send instructions to motor driver 228 via output lines 248. The instruction may be to stop or reduce speed of drum motor 204. In this case motor driver 228 will send a corresponding command (to stop or reduce speed) to drum motor 204 via output lines 252.

The invention has been described in detail with particular reference to certain preferred embodiments thereof, but it will be understood that variations and modifications can be effected within the scope of the invention.

PARTS LIST

100 imaging device
104 tail stock
108 mandrel
112 air holes
116 printing sleeve
120 imaging head
124 imaging head tracks
128 lead screw
132 air inlet into mandrel
136 air hose
140 air source
144 head stock (spindle)
204 drum motor
208 tail stock encoder
212 head stock (drum) encoder
216 belt
220 mandrel lock
224 analyzer
228 motor driver
232 drum motor encoder
236 input line from tail stock encoder
240 input line from head stock
244 input line from drum motor encoder
248 output line from analyzer to motor driver
252 output line from motor driver to drum motor
256 encoder slots
260 alarm

The invention claimed is:

1. A mandrel position analyzer in an imaging device comprising:
   a head stock for a first side of the mandrel;
   a tail stock for a second side of the mandrel;
   a first encoder attached to the head stock adapted to measure first signals wherein the first signals are generated by movement of the mandrel to form a first set of results, wherein the first set of results represents a rotational speed of the mandrel;
   a second encoder attached to the tail stock adapted to measure second signals wherein the second signals are generated by movement of the mandrel to form a second set of results, wherein the second set of results represents the rotational speed of the mandrel;
   an analyzer which compares the first set of results to the second set of results; and
   an alarm;
   wherein if the first set of results is different from the second set of results, the alarm alerts an operator.

2. The mandrel position analyzer according to claim 1 further comprising:
   a third encoder attached to a motor drum wherein the motor drum is adapted to rotate the mandrel to form a third set of results;
   wherein the third encoder is adapted to generate third signals that are generated by the motor drum rotation; and
   wherein the analyzer is configured to compare the first set of results to the third set of results and if the first set of results is different from the third set of results, an abnormal state of a mandrel operation is detected.

* * * * *